US009127365B2

(12) United States Patent
Berger et al.

(10) Patent No.: US 9,127,365 B2
(45) Date of Patent: Sep. 8, 2015

(54) GENERATION OF MULTILAYER STRUCTURES IN A SINGLE SPUTTERING MODULE OF A MULTI-STATION MAGNETIC RECORDING MEDIA FABRICATION TOOL

(75) Inventors: Andreas K. Berger, Donostia-San Sebastian (ES); Yoshihiro Ikeda, San Jose, CA (US); Byron H. Lengsfield, III, Gilroy, CA (US); David T. Margulies, Salinas, CA (US); Ernesto E. Marinero, Saratoga, CA (US)

(73) Assignee: HGST Netherlands B.V., Amsterdam (NL)

( * ) Notice: Subject to any disclaimer, the term of this patent is extended or adjusted under 35 U.S.C. 154(b) by 2307 days.

(21) Appl. No.: 12/032,669

(22) Filed: Feb. 16, 2008

(65) Prior Publication Data

US 2009/0205948 A1 Aug. 20, 2009

(51) Int. Cl.
  *C23C 14/34* (2006.01)
  *C23C 14/56* (2006.01)
  *G11B 5/84* (2006.01)
  *G11B 5/851* (2006.01)
  *G11B 5/66* (2006.01)

(52) U.S. Cl.
  CPC ............ *C23C 14/568* (2013.01); *G11B 5/8404* (2013.01); *G11B 5/851* (2013.01); *G11B 5/66* (2013.01)

(58) Field of Classification Search
  CPC ...... C23C 14/568; G11B 5/66; G11B 5/8404; G11B 5/851
  USPC ................ 204/192.1, 192.12, 192.15, 192.21
  See application file for complete search history.

(56) References Cited

U.S. PATENT DOCUMENTS 4,661,418 A 4/1987 Yanai et al.
5,324,593 A 6/1994 Lal et al.
(Continued)

FOREIGN PATENT DOCUMENTS

JP 62058414 A * 3/1987
JP 62212929 9/1987
(Continued)

OTHER PUBLICATIONS

Piramanayagam et al., "Stacked CoCrPt:SiO2 Layers for Perpendicular Recording Media", IEEE Transactions on Magnetics, vol. 41, No. 10 (Oct. 2005).
(Continued)

Primary Examiner — John Brayton
(74) Attorney, Agent, or Firm — Duft Bornsen & Fettig LLP

(57) ABSTRACT

Methods of fabricating perpendicular magnetic recording media are disclosed. The multilayer structures of the perpendicular magnetic recording media are fabricated by varying the sputtering conditions (i.e., pressure, sputtering gas, etc) in a single sputtering module so that multiple sputtering modules are not needed to form the multilayer structures. These fabrication methods allow sputtering tools with a limited number of chambers, which were designed for the manufacture of longitudinal media, to be used to efficiently produce perpendicular media architectures which heretofore required a large number of sputtering modules. It is further shown that media structures involving a geometric weak-link architecture are suited for these fabrication techniques.

11 Claims, 5 Drawing Sheets

(56) References Cited

U.S. PATENT DOCUMENTS

| | | |
|---|---|---|
| 5,356,522 A | 10/1994 | Lal et al. |
| 5,432,012 A | 7/1995 | Lal et al. |
| 5,693,199 A | 12/1997 | Bourez et al. |
| 5,705,044 A | 1/1998 | Washburn et al. |
| 5,785,825 A | 7/1998 | Hwang et al. |
| 5,851,643 A | 12/1998 | Honda et al. |
| 6,576,328 B2 | 6/2003 | Deng et al. |
| 6,641,703 B2 | 11/2003 | Nomura et al. |
| 6,670,056 B2 | 12/2003 | Hikosaka |
| 6,803,117 B2 | 10/2004 | Akimoto et al. |
| 6,942,933 B2 * | 9/2005 | Osawa .......... 428/827 |
| 7,175,925 B2 * | 2/2007 | Chen et al. .......... 428/831 |
| 7,722,967 B2 * | 5/2010 | Marinero et al. .......... 428/831.2 |
| 7,736,767 B2 * | 6/2010 | Bian et al. .......... 428/831 |
| 2003/0108776 A1 | 6/2003 | Chang et al. |
| 2004/0157087 A1 | 8/2004 | Sakamoto et al. |
| 2005/0178651 A1 | 8/2005 | Ranjan et al. |
| 2005/0186450 A1 | 8/2005 | Takenoiri et al. |
| 2005/0244679 A1 | 11/2005 | Arai et al. |
| 2006/0088737 A1 * | 4/2006 | Hirayama et al. .......... 428/836.2 |
| 2006/0090998 A1 | 5/2006 | Honda et al. |
| 2006/0127703 A1 | 6/2006 | Takekuma et al. |
| 2006/0166039 A1 | 7/2006 | Berger et al. |
| 2006/0177703 A1 | 8/2006 | Takenoiri et al. |
| 2006/0177704 A1 | 8/2006 | Berger et al. |
| 2006/0199042 A1 | 9/2006 | Fullerton et al. |
| 2006/0204791 A1 | 9/2006 | Sakawaki et al. |
| 2006/0222902 A1 | 10/2006 | Mukai |
| 2006/0228588 A1 | 10/2006 | Suzuki et al. |
| 2006/0246323 A1 * | 11/2006 | Liu et al. .......... 428/829 |

FOREIGN PATENT DOCUMENTS

| | | |
|---|---|---|
| JP | 63044319 | 2/1988 |
| JP | 63313317 | 12/1988 |
| JP | 1049126 | 2/1989 |
| JP | 1176310 | 7/1989 |
| JP | 3259414 | 11/1991 |
| JP | 4047527 | 2/1992 |
| JP | 5182169 | 7/1993 |
| JP | 7192264 | 7/1995 |
| JP | 7326051 | 12/1995 |
| JP | 10053877 | 2/1998 |
| JP | 2000306696 | 11/2000 |
| JP | 2003317220 | 11/2003 |
| JP | 2004022138 | 1/2004 |

OTHER PUBLICATIONS

Jung et al., "CoCrPtO-Based Granular Composite Perpendicular Recording Media", IEEE Transactions on Magnetics, vol. 43, No. 6 (Jun. 2007).

* cited by examiner

GENERATION OF MULTILAYER STRUCTURES IN A SINGLE SPUTTERING MODULE OF A MULTI-STATION MAGNETIC RECORDING MEDIA FABRICATION TOOL

BACKGROUND OF THE INVENTION

1. Field of the Invention

The invention is related to the field of fabrication of perpendicular magnetic recording media and, in particular, to the growth of certain multilayer structures of a recording media structure in a single sputtering process module of a multi-station manufacturing tool.

2. Statement of the Problem

Many computer systems use magnetic disk drives for mass storage of information. Magnetic disk drives have typically been longitudinal magnetic recording systems, where magnetic data is recorded as magnetic transitions formed with their magnetization aligned parallel to the disk surface. The surface of the disk is magnetized in a direction along a track of data and then switched to the opposite direction, both directions being parallel with the surface of the disk and parallel with the direction of the data track.

Unfortunately, data density requirements are fast approaching the physical limits. Overall data density (or areal density) may be improved by improving linear density and/or track density. To improve linear density, bit sizes on a track need to be reduced which in turn requires decreasing the grain size of the magnetic medium. As this grain size shrinks, the thermal stability of the written domains decreases. Therefore, materials with higher magnetic anisotropy are utilized thereby requiring higher magnetic fields to be reversed.

One way to achieve higher density recordings is with perpendicular recording. In perpendicular recording systems, bits of data are recorded with their magnetization perpendicular to the plane of the surface of the disk. A perpendicular magnetic recording disk is generally formed by depositing on a suitable substrate an adhesion layer, a soft magnetic underlayer (SUL) stack, a seed layer(s), an intermediate non-magnetic layer(s), a magnetic recording layer(s), a capping layer(s), and an overcoat structure. The adhesion layer is formed on the substrate to improve adhesion of subsequently deposited layers to the substrate. The soft magnetic underlayer (SUL) stack serves to concentrate a magnetic flux emitted from a main pole of a write element and to act as a flux return path back to a return pole of the write element during recording on the magnetic recording layer. The seed layer(s) provide a transition for the growth of crystalline thin films on the amorphous SUL layers. The intermediate layer(s) controls the crystallographic texture, grain size, and the segregation of the magnetic recording layer. The intermediate layer also serves to magnetically de-couple the SUL stack and the magnetic recording layer. The magnetic recording layer(s) act as a storage layer for the data encoded as bit transitions. The capping layer(s) are employed to improve the recording media writeability and noise performance.

The layers of perpendicular magnetic recording media are formed by sequentially sputtering the layers on the substrate. Each individual layer of the perpendicular magnetic recording media is sputtered in a separate sputtering processing module (station) of a multi-station thin film deposition tool. The following paragraphs describe a typical fabrication process for perpendicular magnetic recording media.

A substrate is loaded onto a carrier mechanism in a loading chamber of the fabrication tool. The carrier mechanism then transports the substrate to a first sputtering process module. The desired sputtering conditions are set for the first sputtering module, and an adhesion layer, such as AlTi, NiTa, etc, is sputtered onto the substrate. The carrier mechanism then transports the substrate to a second sputtering module.

The next three sputtering modules form an antiparallel (AP) SUL stack. To form the AP SUL stack, the desired sputtering conditions are set for the second sputtering module, and a first layer of the SUL stack, such as a CoTaZr-based alloy, is sputtered onto the adhesion layer. The carrier mechanism then transports the substrate to a third sputtering module. The desired sputtering conditions are set for the third sputtering module, and a second layer of the SUL stack, such as Ru, is sputtered onto the first SUL layer. The carrier mechanism then transports the substrate to a fourth sputtering module. The desired sputtering conditions are set for the fourth sputtering module, and a third layer of the SUL stack, such as a CoTaZr-based alloy, is sputtered onto the second SUL layer. The carrier mechanism then transports the substrate to a fifth sputtering module.

The next two sputtering modules form a multilayer seed layer. To form the multilayer seed layer, the desired sputtering conditions are set for the fifth sputtering module, and a first seed layer, such as a CrTi, is sputtered onto the third SUL layer. The carrier mechanism then transports the substrate to a sixth sputtering module. The desired sputtering conditions are set for the sixth sputtering module, and a second seed layer, such as NiW or NiWCr, is sputtered onto the first seed layer. The carrier mechanism then transports the substrate to a seventh sputtering module.

The next two sputtering modules form a multilayer intermediate layer. This intermediate layer is typically non-magnetic and serves to decouple the magnetic recording layer from the SUL. This layer also serves as a growth template for the magnetic layers that will be deposited in the next sputtering modules. To form the multilayer intermediate layer, the desired sputtering conditions are set for the seventh sputtering module, and a first intermediate layer, such as a Ru (low pressure), is sputtered onto the second seed layer. The carrier mechanism then transports the substrate to an eighth sputtering module. The desired sputtering conditions are set for the eighth sputtering module, and a second intermediate layer, such as Ru (high pressure), is sputtered onto the first intermediate layer. The carrier mechanism then transports the substrate to a ninth sputtering module.

The desired sputtering conditions are set for the ninth sputtering module, and a magnetic recording layer(s), such as a CoPtCr-based alloy, is sputtered onto the second intermediate layer. It has been found that improved recording properties can be derived if a plurality of magnetic layers (two or more) is employed as the storage medium. For example, the stack may include magnetic layers differing in composition and magnetic properties to generate a magnetically modulated recording structure across the thickness of the recording layer. This permits improvements in writeability, jitter, and signal-to-noise. Therefore, it is common in current-art media fabrication to employ a plurality of sputtering modules housing magnetic targets with different compositions to fabricate a compositionally modulated storage layer. The carrier mechanism then transports the substrate to a tenth sputtering module. The desired sputtering conditions are set for the tenth sputtering module, and a capping layer(s), such as CoPtCrB, is sputtered onto the magnetic recording layer. As in the case of the storage layer, it is also advantageous to employ a plurality of layers for achieving the functionality of the capping layer (improved writeability through exchange coupling of the recording layer with a softer overlayer, such as the cap layer, whose magnetization orientation is more easily altered by the writing field). At least two layers are employed in some designs with one of the layers mediating the exchange coupling between the storage layer and the cap. The carrier mechanism then transports the substrate to an eleventh sputtering module. The desired sputtering conditions are set for the eleventh sputtering module, and a first overcoat layer, such as IBD, is sputtered onto the capping layer. The carrier mechanism then transports the substrate to a twelfth sputtering module. The desired sputtering conditions are set for the twelfth sputtering module, and a second overcoat layer, such as CNx, is sputtered onto the first overcoat layer. The carrier mechanism then transports the substrate to an unloading chamber.

As is evident from the above fabrication process, twelve or more individual sputtering modules are used to form the perpendicular magnetic recording media. The number of different sputtering steps used for fabricating longitudinal recording media is usually less than twelve. Thus, many existing fabrication tools have less than twelve sputtering modules. Therefore, it was widely accepted in the industry that current-art fabrication tools developed for fabricating longitudinal magnetic recording media are inadequate for the manufacturing of perpendicular recording media. In order to fabricate the perpendicular magnetic recording media described above, disk drive manufacturers may have to update their fabrication tools, which comes at a very high investment. It would therefore be desirable to find ways to use existing fabrication tools to fabricate perpendicular magnetic recording media.

SUMMARY

Embodiments of the invention solve the above and other related problems by fabricating multiple layers of perpendicular magnetic recording media in single sputtering modules by sputtering using a common composition target under varying sputtering conditions. By changing the sputtering conditions, multilayer structures of perpendicular magnetic recording media may be formed in single sputtering modules. As a result, the total number of sputtering modules used to fabricate perpendicular magnetic recording media may be reduced so that current-art longitudinal media fabrication tools may be used. Disk drive manufacturers thus do not need to invest large amounts of capital into updating their fabrication tools in order to manufacture perpendicular magnetic recording media. In addition, these techniques may also be applied to sputtering tools where multiple cathodes are present in a single chamber. Thus, one can further increase the ability of these tools to rapidly produce flexible, multilayer media structures in a minimum number of sputtering modules.

One embodiment of the invention comprises a method of fabricating perpendicular magnetic recording media. The method includes sputtering an adhesion layer on a substrate, sputtering an SUL stack on the adhesion layer, and sputtering a seed layer on the SUL stack. The method further includes sputtering an intermediate layer on the seed layer, sputtering a magnetic recording layer on the intermediate layer, sputtering a capping layer on the magnetic recording layer, and sputtering an overcoat layer on the capping layer. One or more of the layers of the perpendicular magnetic recording media may comprise multilayer structures formed from the same material, such as one or more of the seed layer, the intermediate layer, the magnetic recording layer, and the capping layer. The multilayer structures of the perpendicular magnetic recording media are fabricated (from a common sputtering target) by varying (or altering) the sputtering conditions in the same sputtering module. By varying the sputtering conditions, such as the pressure, the sputtering gas composition, the growth rate, bias, etc, thin films deposited from a common sputtering target will exhibit different microstructural properties. and therefore, variations of such parameters during the deposition of said target material may be employed to fabricate a multilayer structure with optimized microstructural properties in a single sputtering module.

The invention may include other exemplary embodiments described below.

DESCRIPTION OF THE DRAWINGS

The same reference number represents the same element or same type of element on all drawings.

DETAILED DESCRIPTION OF THE INVENTION

FIGS. 1-8 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1:
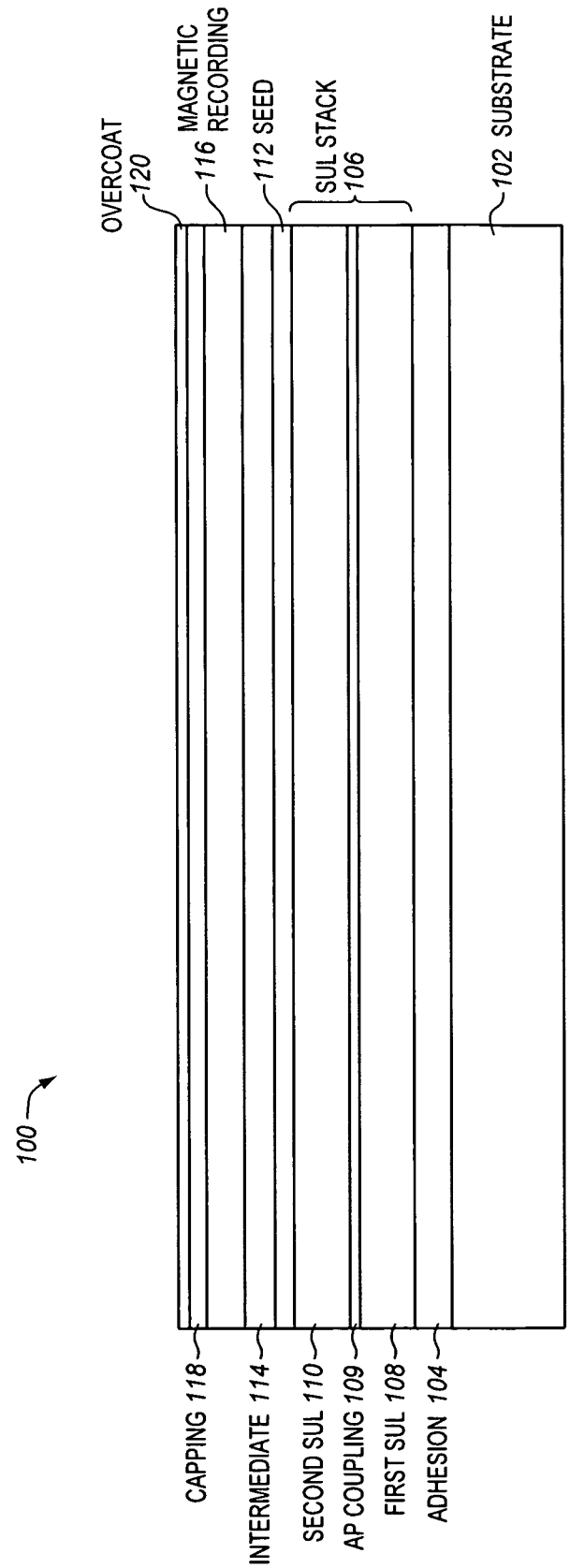
FIG. 1 is a cross-sectional view of perpendicular magnetic recording media in an exemplary embodiment of the invention.

FIG. 1 is a cross-sectional view of perpendicular magnetic recording media 100 in an exemplary embodiment of the invention. The illustration of perpendicular magnetic recording media 100 is of the basic building blocks of the media. Perpendicular magnetic recording media 100 is fabricated by depositing multiple thin films on a substrate 102 (e.g., a glass or AlMg substrates). Perpendicular magnetic recording media 100 may or may not include an adhesion layer 104 formed on the substrate 102. Perpendicular magnetic recording media 100 further includes a SUL stack 106 formed on adhesion layer 104. SUL stack 106 has an antiparallel (AP) structure comprising a first ferromagnetic SUL layer 108, an AP coupling layer 109, and a second ferromagnetic SUL layer 110. Perpendicular magnetic recording media 100 further includes a seed layer 112 formed on the SUL stack 106. Although the term "layer" is used in singular form, seed layer 112 and other layers in perpendicular magnetic recording media 100 may be comprised of multiple layers. Perpendicular magnetic recording media 100 further includes an intermediate layer 114 formed on the seed layer 112, and a magnetic recording layer 116 formed on the intermediate layer 114. Perpendicular magnetic recording media 100 further includes a capping layer 118 formed on the magnetic recording layer 116, and an overcoat layer 120 formed on the capping layer 118.

FIG. 1 illustrates just one embodiment of the layers of perpendicular magnetic recording media 100. In other embodiments, the layers of perpendicular magnetic recording media 100 may be rearranged or may be substituted with other layers.

As described in the Background, conventional methods of fabricating perpendicular magnetic recording media use a fabrication tool comprising a plurality of independent sputtering processing modules or often referred as process stations, which are housed within the same deposition tool vacuum assembly. A substrate is placed in the fabrication tool and the layers of the perpendicular magnetic recording media are sputtered onto the substrate. The fabrication tool includes a plurality of sputtering modules, where each sputtering module is adapted to sputter a layer of material from a sputtering target based on a particular set of sputtering conditions. Thus, when a multilayer structure is fabricated, a different sputtering module is needed to form each layer of the multilayer structure. According to embodiments provided herein, multilayer structures of perpendicular magnetic recording media 100 as illustrated in FIG. 1 do not need to be fabricated in different sputtering modules.

Figure 2:
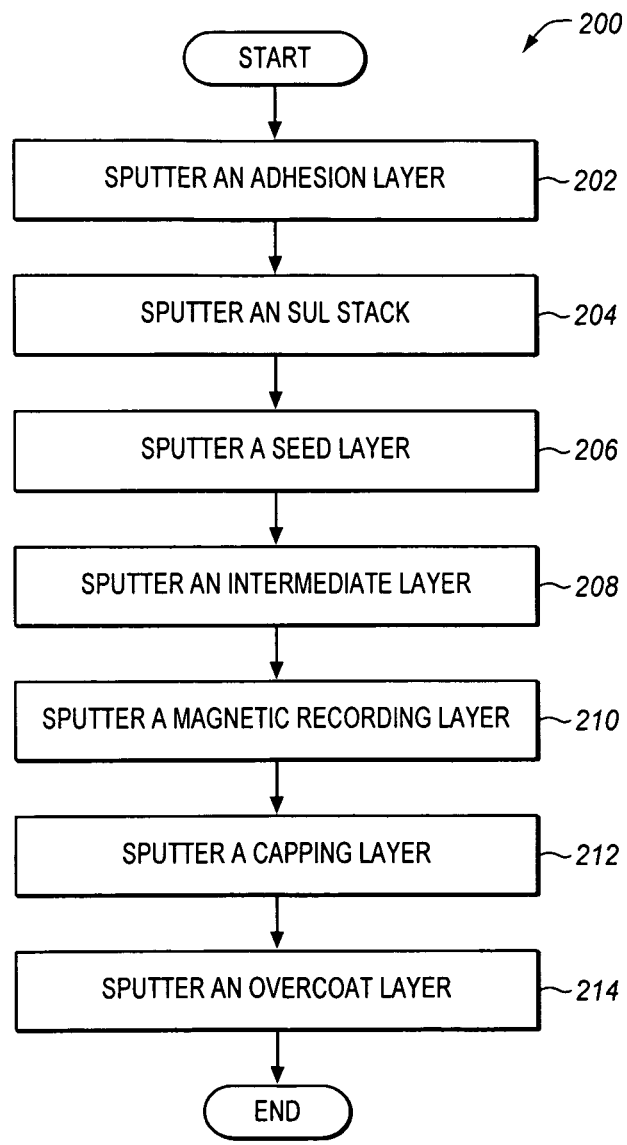
FIG. 2 is a flow chart illustrating a method of fabricating perpendicular magnetic recording media in an exemplary embodiment of the invention.

FIG. 2 is a flow chart illustrating a method 200 of fabricating perpendicular magnetic recording media 100 in an exemplary embodiment of the invention. Method 200 illustrates just one embodiment, and there may be many variations from this embodiment that are within the scope of the invention. The steps of method 200 will be described in reference to FIG. 1.

Step 202 comprises sputtering an adhesion layer 104 on substrate 102. For the specification and claims "on" means "above", but not necessarily "in contact with". Step 204 comprises sputtering an SUL stack 106 on the adhesion layer 104. To sputter the SUL stack 106, step 204 may comprise the further steps of sputtering a first ferromagnetic SUL layer 108, sputtering an AP coupling layer 109, and sputtering a second ferromagnetic SUL layer 110. Present SUL stacks employ AP coupled high permeability amorphous films to minimize magnetic noise interference with the layer where the encoded information is stored. Applying the teachings of this invention, it is possible to overcome the noise contributions of a single layer SUL by employing the multi-step processing to control its magnetic domain structure, thereby dispensing with the need to employ a separate sputtering module to deposit the AP coupling layer, such as Ru.

Step 206 comprises sputtering a seed layer 112 on the SUL stack 106. Step 208 comprises sputtering an intermediate layer 114 on the seed layer 112. Step 210 comprises sputtering a magnetic recording layer 116 on the intermediate layer 114. Step 212 comprises sputtering a capping layer 118 on the magnetic recording layer 116. Step 214 comprises sputtering an overcoat layer 120 on the capping layer 118.

One or more of the layers of perpendicular magnetic recording media 100 may comprise multilayer structures formed from the same material. For instance, one or more of seed layer 112, intermediate layer 114, magnetic recording layer 116, and capping layer 118 may be comprised of a multilayer structure. Instead of fabricating the multilayer structures in separate sputtering modules as is presently performed, the multilayer structures of perpendicular magnetic recording media 100 are fabricated (from a common sputtering target) by varying the sputtering conditions in the same sputtering module. By varying the sputtering conditions, such as the pressure, the sputtering gas, bias voltage, etc, a multilayer structure with a desired microstructure may be fabricated in a single sputtering module. As a result, conventional fabrication tools having a limited number of sputtering modules may be used to fabricate perpendicular magnetic recording media 100.

As one example, assume that seed layer 112 comprises a multilayer structure formed from the same material. To sputter seed layer 112 in step 206, substrate 102 is introduced into a sputtering module with a seed material target. The seed material target may comprise a NiWCr-based alloy or another type of material. A first seed layer is then sputtered at a first pressure to achieve a desired thickness of the first seed layer. A second seed layer is then sputtered at a second pressure (which is different than the first pressure) to achieve a desired thickness of the second seed layer. By varying the sputtering conditions (i.e., pressure) in this example, a multilayer seed layer 112 may be formed in a single sputtering module to have a desired structure. Although seed layer 112 includes two layers in this example, those skilled in the art will appreciate that seed layer 112 may include more layers in other examples.

As another example, assume that intermediate layer 114 comprises a multilayer structure formed from the same material. To sputter intermediate layer 114 in step 208, substrate 102 is introduced into a sputtering module with an intermediate material target. The intermediate material target may comprise Ru, RuCr alloys (with the Cr content ranging from 0 to 20%), or another type of material. A first intermediate layer is then sputtered at a first pressure to achieve a desired thickness of the first intermediate layer. A second intermediate layer is then sputtered at a second pressure (which is different than the first pressure) to achieve a desired thickness of the second intermediate layer. By varying the sputtering conditions (i.e., pressure) in this example, a multilayer intermediate layer 114 may be formed in a single sputtering module to have a desired structure.

As another example, assume that magnetic recording layer 116 comprises a multilayer structure formed from the same material. To sputter magnetic recording layer 116 in step 210, substrate 102 is introduced into a sputtering module with a recording material target. The recording material target may comprise a CoPtCr-based alloy or another type of material. A first magnetic recording layer is then sputtered at a first pressure using a first sputtering gas to achieve a desired thickness of the first magnetic recording layer. The first sputtering gas may comprise an inert gas, such as Ar, and Oxygen. A second magnetic recording layer is then sputtered at the first pressure using the first sputtering gas to achieve a desired thickness of the second magnetic recording layer. A third magnetic recording layer is then sputtered at a second pressure using a second sputtering gas to achieve a desired thickness of the third magnetic recording layer. The second sputtering gas may comprise just an inert gas, such as Ar. By varying the sputtering conditions (i.e., pressure and sputtering gas) in this example, a multilayer magnetic recording layer 116 may be formed in a single sputtering module to have a desired structure.

Figure 3:
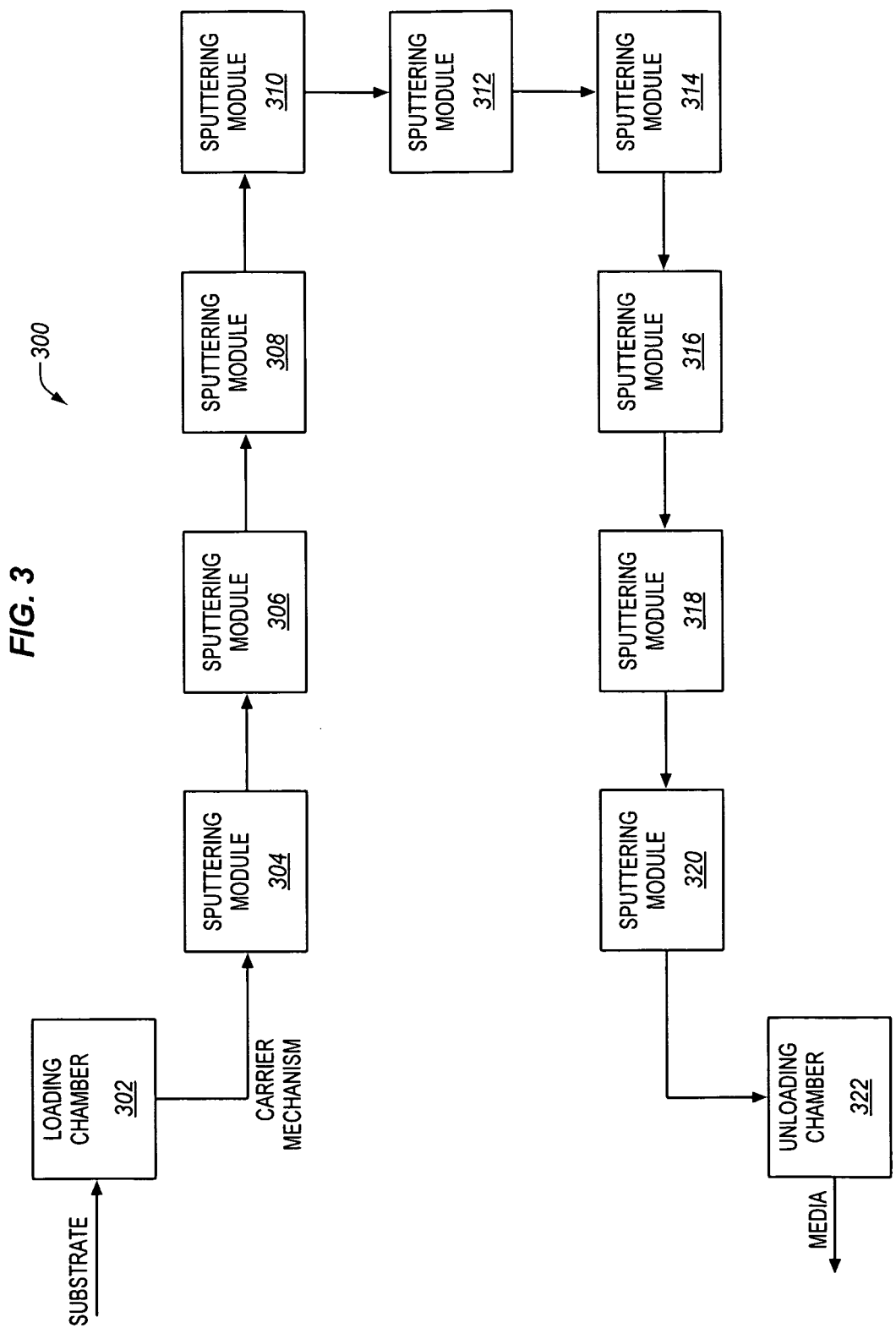
FIG. 3 illustrates a fabrication process for fabricating perpendicular magnetic recording media in a multi-station sputtering tool in an exemplary embodiment of the invention.

FIG. 3 illustrates a fabrication process for fabricating perpendicular magnetic recording media 100 in a fabrication tool 300 in an exemplary embodiment of the invention. Fabrication tool 300 includes nine sputtering modules in this embodiment, although those skilled in the art will appreciate that fabrication tools may include more or less sputtering modules in other embodiments.

To start the fabrication process, a substrate 102 is loaded onto a carrier mechanism in a loading chamber 302. The carrier mechanism then transports the substrate 102 to a first sputtering module 304. Sputtering module 304 sputters adhesion layer 104 on substrate 102. Adhesion layer 104 may be formed from AlTi, NiTa, or another target that is sputtered to a thickness of about 1-10 nanometers. The carrier mechanism then transports the substrate 102 to a second sputtering module 306. Sputtering module 306 sputters a first SUL layer 108 on adhesion layer 104. The first SUL layer 108 may be formed from a CoTaZr-based alloy or another target that is sputtered to a thickness of about 5 to 50 nanometers. The carrier mechanism then transports the substrate 102 to a third sputtering module 308. Sputtering module 308 sputters an AP coupling layer 109 on the first SUL layer 108. The AP coupling layer 109 may be formed from Ru or another target that is sputtered to a thickness of about 0.4 to 1.0 nanometers. The carrier mechanism then transports the substrate 102 to a fourth sputtering module 310. Sputtering module 310 sputters a second SUL layer 110 on AP coupling layer 109. The second SUL layer 110 may be formed from a CoTaZr-based alloy or another target that is sputtered to a thickness of about 5 to 50 nanometers.

Figure 4:
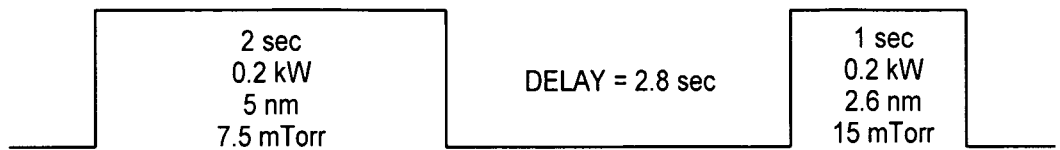
FIG. 4 illustrates sputtering conditions for fabricating a multilayer seed layer in an exemplary embodiment of the invention.

The carrier mechanism then transports the substrate 102 to a fifth sputtering module 312. Sputtering module 312 is adapted to fabricate a multilayer seed layer 112 on the second SUL layer 110. To fabricate the multilayer seed layer 112 in sputtering module 312, the sputtering conditions are varied. FIG. 4 illustrates sputtering conditions for fabricating the multilayer seed layer 112 in an exemplary embodiment of the invention. Assume for this embodiment that the seed material target is NiWCr, although other seed material targets may be used. Sputtering module 312 sputters a first seed layer at 7.5 mTorr for about 2 seconds to achieve a thickness of about 5 nanometers. After a 2.8 second delay (such as by turning off the plasma voltage), sputtering module 312 sputters a second seed layer at 15 mTorr for about 1 second to achieve a thickness of about 2.6 nanometers. Those skilled in the art will appreciate that numerous permutations of time duration, deposition rates, sputter pressures, delay times, etc, may be used to form seed layer 112.

Figure 5:
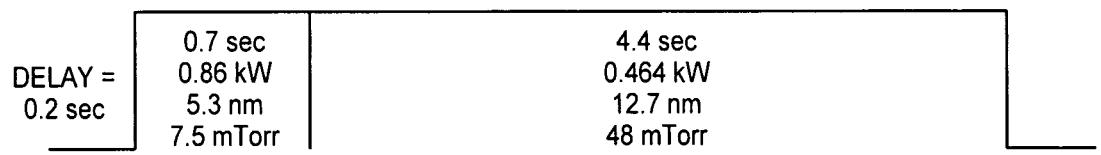
FIG. 5 illustrates sputtering conditions for fabricating a multilayer intermediate layer in an exemplary embodiment of the invention.

The carrier mechanism then transports the substrate 102 to a sixth sputtering module 314. Sputtering module 314 is adapted to fabricate a multilayer intermediate layer 114 on the seed layer 112. To fabricate the multilayer intermediate layer 114 in sputtering module 314, the sputtering conditions are varied. FIG. 5 illustrates sputtering conditions for fabricating the multilayer intermediate layer 114 in an exemplary embodiment of the invention. Assume for this embodiment that the intermediate material target is Ru, although other intermediate material targets may be used. Sputtering module 314 delays for 0.2 seconds before the cathodes are ignited, and then sputters a first intermediate layer at 7.5 mTorr for about 0.7 seconds to achieve a thickness of about 5.3 nanometers. At the end of the 0.7 second deposition cycle, the sputter pressure is incremented in sputtering module 314 to about 48 mTorr. The second intermediate layer is then sputtered at this pressure for about 4.4 seconds to achieve a thickness of about 12.7 nanometers. Those skilled in the art will appreciate that numerous permutations of time duration, deposition rates, sputter pressures, delay times, etc, may be used to form intermediate layer 114.

Figure 6:
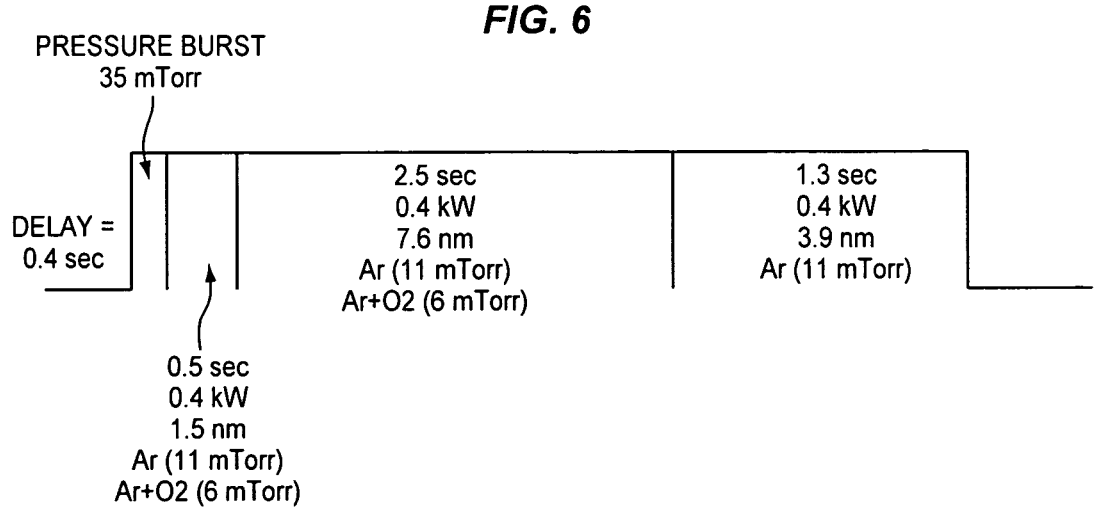
FIG. 6 illustrates sputtering conditions for fabricating a multilayer magnetic recording layer in an exemplary embodiment of the invention.

The carrier mechanism then transports the substrate 102 to a seventh sputtering module 316. Sputtering module 316 is adapted to fabricate a multilayer magnetic recording layer 116 on the intermediate layer 114. To fabricate the multilayer magnetic recording layer 116 in sputtering module 316, the sputtering conditions are varied. FIG. 6 illustrates sputtering conditions for fabricating the multilayer magnetic recording layer 116 in an exemplary embodiment of the invention. Assume for this embodiment that the recording material target is a CoPtCr-based alloy, although other recording material targets may be used. Sputtering module 316 is then programmed to wait for about 0.4 seconds before cathode ignition, and follows with a high pressure burst (about 35 mTorr) of a sputtering gas. Sputtering module 316 then sputters a first magnetic recording layer at a total pressure of about 17 mTorr (pressure for Ar and Oxygen) for a duration of approximately 0.5 seconds to achieve a thickness of about 1.5 nanometers. At the end of the 0.5 second deposition cycle, sputtering module 316 sputters a second magnetic recording layer at the same sputter pressure for about 2.5 seconds with a −250 volt bias voltage applied to achieve a thickness of about 7.6 nanometers. At the end of the 2.5 second deposition cycle, sputtering module 316 sputters a third magnetic recording layer in pure Ar at a pressure of about 11 mTorr with the same bias voltage to achieve a thickness of about 3.9 nanometers. Those skilled in the art will appreciate that numerous permutations of time duration, deposition rates, sputter pressures, delay times, etc, may be used to form magnetic recording layer 116.

The carrier mechanism then transports the substrate 102 to an eighth sputtering module 318. Sputtering module 318 sputters the capping layer 118 on magnetic recording layer 116. Capping layer 118 may be formed from CoPtCrB or another target. The carrier mechanism then transports the substrate 102 to a ninth sputtering module 320. Sputtering module 320 sputters an overcoat layer 120 on capping layer 118. Overcoat layer 120 may be formed from IBD, CNx, or another target. The carrier mechanism then transports the substrate 102 to an unloading chamber 322.

By changing the sputtering conditions, multilayer structures of perpendicular magnetic recording media 100 may be formed in a single sputtering module. As a result, the total number of sputtering modules used to fabricate perpendicular magnetic recording media 100 may be reduced so that existing fabrication tools may be used. For instance, only nine sputtering modules are needed in the embodiment of FIG. 3. In present fabrication processes, twelve or more sputtering modules are needed. Thus, the embodiments provided herein allow for fewer sputtering modules to be used. As a result, disk drive manufacturers thus do not need to invest large amounts of capital into updating their fabrication tools in order to fabricate perpendicular magnetic recording media.

In addition to the embodiments provided above for fabricating a multilayer magnetic recording layer 116, the following provides some alternative embodiments for fabricating magnetic recording layer 116. When CoCrPt-based alloys are used for the magnetic recording layer, non-magnetic Cr segregates to the grain boundaries that magnetically isolate the magnetic crystal grains. However, the size of the Cr boundaries is small, which results in a high amount of exchange coupling between magnetic crystal grains that contributes to unwanted noise. To reduce the exchange coupling, segregation of the magnetic crystal grains may be promoted with oxides and nitrides (referred to herein as segregants) to form a granular medium. With the magnetic crystal grains segregated by sufficient grain boundaries, the media noise may be reduced.

Figure 7:
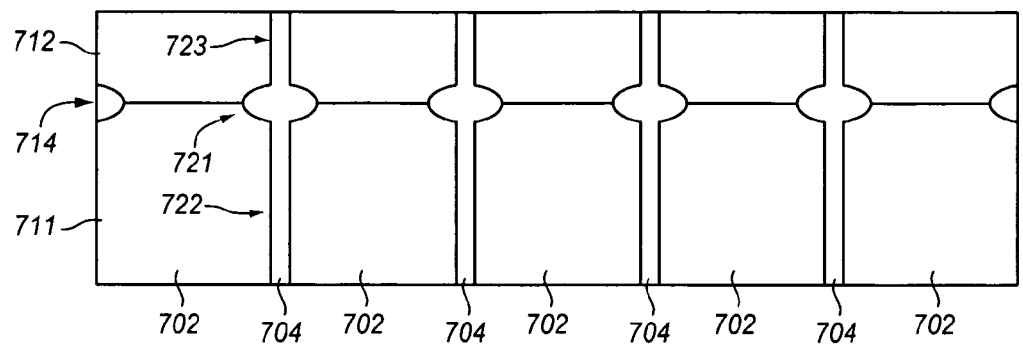
FIG. 7 illustrates grain boundaries in a magnetic recording layer in an exemplary embodiment of the invention.

FIG. 7 illustrates grain boundaries 704 in magnetic recording layer 116 in an exemplary embodiment of the invention. Magnetic recording layer 116 in this embodiment is formed from a first magnetic recording layer 711 and a second magnetic recording layer 712. Magnetic recording layers 711-712 are formed from a recording material target such as CoCrPt with a segregant such as $SiO_2$. The magnetic recording layers 711-712 are sputtered in a single sputtering module much as described above. Due to the formation of magnetic recording layers 711-712, the $SiO_2$ segregates to surround the CoCrPt which forms magnetic crystal grains 702 that are separated by grain boundaries 704.

According to embodiments provided herein, the area of grain boundaries 704 are increased at the interface 714 between the first magnetic recording layer 711 (the hard magnetic layer) and the second magnetic recording layer 712 (the soft magnetic layer). For example, the area of grain boundaries 704 at location 721 is larger than at locations 722 and 723. The area of grain boundaries 704 may be increased or decreased by varying sputtering conditions. For example, a change the oxygen content in the plasma gas mixture from zero to 2% results in a reduction of the magnetic grain size of 12%. This may be attributed to an increase in the amount of segregant at the grain boundaries 704. Controlling the area of the grain boundaries 704 allows for optimization the interlayer coupling between the first magnetic recording layer 711 and the second magnetic recording layer 712.

Interlayer coupling (J) is generally defined by the local exchange coupling strength density ($j_{el}$) multiplied by the grain interface area (A), which is $J=j_{el}*A$. The grain interface area is defined by the area of contact between the first magnetic recording layer 711 and the second magnetic recording layer 712 at interface 714. Thus, by increasing the area (or size) of the grain boundaries 704 at the interface 714 between the first magnetic recording layer 711 and the second magnetic recording layer 712, the area of contact between the first magnetic recording layer 711 and the second magnetic recording layer 712 is reduced. And consequently, the interlayer coupling between the first magnetic recording layer 711 and the second magnetic recording layer 712 is reduced. This media architecture thus controls the inter-layer exchange interactions by means of a "geometric weak-link" at the boundary between the hard and the soft magnetic layers.

Intergranular exchange plays a leading role in determining the recording performance of magnetic media. In perpendicular media, exchange counteracts the deleterious effects of demagnetization interactions. Modest exchange leads to an optimum switching field distribution resulting in low noise and excellent resolution. However, increasing exchange improves the writeability of the media and can result in larger than desired write-widths. In addition, excessive exchange gives rise to clusters of grains at the transition between magnetically-defined bits. These grain clusters result in increased noise and thus, reduce the performance of a recording system. In a dual layer perpendicular media with a soft capping layer and a hard base layer, exchange is optimally controlled in the system by varying the physical and magnetic properties of the capping layer. However, this soft magnetic capping layer serves several, often contradictory functions. The capping layer controls both the inter-granular exchange in the system, which is the dominant contribution to noise and resolution, as well as vertical exchange which is the dominant contribution to the writeability of the media. As a result of the multiple roles played by the capping layer in present perpendicular recording, techniques to segregate and control these functions, such as the methods disclosed herein, lead to improved recording performance.

Figure 8:
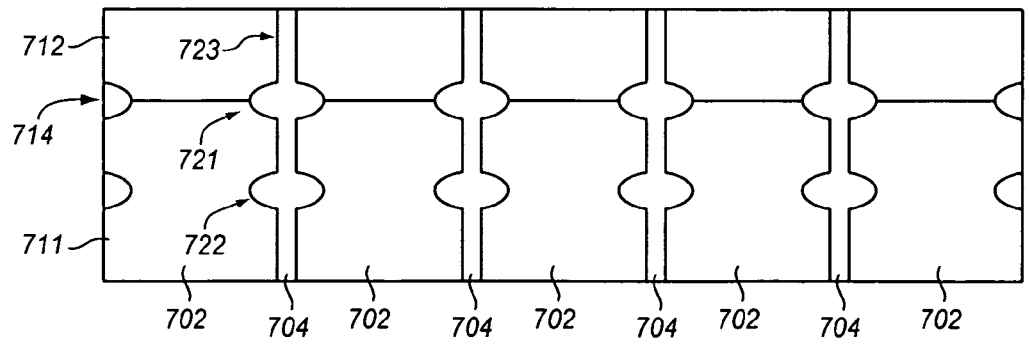
FIG. 8 illustrates grain boundaries in a magnetic recording layer in another exemplary embodiment of the invention.

In addition to increasing the area of the grain boundaries 704 at the interface 714 between the first magnetic recording layer 711 and the second magnetic recording layer 712, the area of the grain boundaries 704 may additionally be increased in other locations in the first magnetic recording layer 711 and the second magnetic recording layer 712. FIG. 8 illustrates grain boundaries 704 in magnetic recording layer 116 in another exemplary embodiment of the invention. In this embodiment, the area of grain boundaries 704 are increased at the interface 714 between the first magnetic recording layer 711 and the second magnetic recording layer 712, and one or more other locations. For example, the area of grain boundaries 704 at location 721 and location 722 are larger than at location 723. There may be multiple other locations where the areas of the grain boundaries are increased to provide desired media performance.

Although specific embodiments were described herein, the scope of the invention is not limited to those specific embodiments. The scope of the invention is defined by the following claims and any equivalents thereof.

We claim:

1. A method of fabricating perpendicular magnetic recording media, the method comprising:
   sputtering an adhesion layer;
   sputtering a soft magnetic underlayer (SUL) on the adhesion layer;
   sputtering a seed layer on the SUL;
   sputtering an intermediate layer on the seed layer;
   sputtering a magnetic recording layer on the intermediate layer; and
   sputtering a capping layer;
   wherein at least one of the seed layer, the intermediate layer, the magnetic recording layer, and the capping layer is comprised of a multilayer structure that is formed in a single sputtering module by performing a sputtering process using a common sputtering target under varying sputtering conditions;
   wherein a grain growth substantially terminates at an interface between layers of the multilayer structure used to form at least one of the seed layer, the intermediate layer, the magnetic recording layer, and the capping layer.

2. The method of claim 1 further comprising:
   sputtering an overcoat layer on the capping layer.

3. The method of claim 1 wherein sputtering a seed layer comprises:
   sputtering a first seed layer at a first pressure to a first thickness using a seed material target; and
   sputtering a second seed layer at a second pressure to a second thickness using the seed material target;
   wherein the processes of sputtering the first seed layer and the second seed layer are performed in a single sputtering module.

4. The method of claim 3 wherein the seed material target comprises a NiWCr-based alloy.

5. The method of claim 1 wherein sputtering an intermediate layer comprises:
   sputtering a first intermediate layer at a first pressure to a first thickness using an intermediate material target; and
   sputtering a second intermediate layer at a second pressure to a second thickness using the intermediate material target;
   wherein the processes of sputtering the first intermediate layer and the second intermediate layer are performed in a single sputtering module.

6. The method of claim 5 wherein the intermediate material target comprises Ru or RuCr alloys.

7. The method of claim 1 wherein sputtering a magnetic recording layer comprises:

sputtering a first magnetic recording layer at a first pressure to a first thickness using a recording material target and a first sputtering gas;

sputtering a second magnetic recording layer at the first pressure to a second thickness using the recording material target and the first sputtering gas; and sputtering a third magnetic recording layer at a second pressure to a third thickness using the recording material target and a second sputtering gas;

wherein the processes of sputtering the first magnetic recording layer, the second magnetic recording layer, and the third magnetic recording layer are performed in a single sputtering module.

8. The method of claim 7 wherein the recording material target comprises a CoPtCr-based alloy.

9. The method of claim 7 wherein:

the first sputtering gas comprises an inert gas and oxygen; and the second sputtering gas comprises the inert gas.

10. The method of claim 1 wherein sputtering a magnetic recording layer comprises:

sputtering a first magnetic recording layer to a first thickness using a recording material target and a segregant; and sputtering a second magnetic recording layer to a second thickness using the recording material target and the segregant;

wherein the recording material forms magnetic crystal grains separated by grain boundaries promoted by the segregant;

wherein the sputtering conditions are varied to increase the area of the grain boundaries at the interface between the first magnetic recording layer and the second magnetic recording layer.

11. The method of claim 10 wherein the sputtering conditions are varied to increase the area of the grain boundaries at other locations in addition to the interface between the first magnetic recording layer and the second magnetic recording layer.

* * * * *